(12) United States Patent
Walsh et al.

(10) Patent No.: US 8,881,794 B2
(45) Date of Patent: Nov. 11, 2014

(54) COOLING DEVICE

(75) Inventors: Edmond Walsh, Tipperary (IE); Ronan Grimes, County Clare (IE); Jeff Punch, County Limerick (IE)

(73) Assignee: University of Limerick, Limerick (IE)

( * ) Notice: Subject to any disclaimer, the term of this patent is extended or adjusted under 35 U.S.C. 154(b) by 1088 days.

(21) Appl. No.: 12/084,891

(22) PCT Filed: Nov. 17, 2006

(86) PCT No.: PCT/IE2006/000129
§ 371 (c)(1),
(2), (4) Date: May 13, 2008

(87) PCT Pub. No.: WO2007/057871
PCT Pub. Date: May 24, 2007

(65) Prior Publication Data
US 2009/0145584 A1    Jun. 11, 2009

(30) Foreign Application Priority Data

Nov. 17, 2005  (IE) ..................................... 2005/0766
Jul. 12, 2006  (IE) ..................................... 2006/0509

(51) Int. Cl.
  *F24B 1/06*     (2006.01)
  *F04D 29/58*    (2006.01)
  *F04D 29/68*    (2006.01)
  *H01L 23/467*   (2006.01)
  *F28D 15/00*    (2006.01)

(52) U.S. Cl.
  CPC ............ *F04D 29/582* (2013.01); *F04D 29/681* (2013.01); *H01L 23/467* (2013.01)
  USPC ..................... 165/104.34; 165/125

(58) Field of Classification Search
  CPC ...... H01L 23/467; G06F 1/20; F28F 2250/00; F28F 2250/10; F28F 2250/08; F28F 2250/02; F28F 13/02; F04D 29/582; F04D 29/681
  USPC ......... 165/80.3, 104.33, 104.34, 122, 104.21, 165/125, 126; 361/695, 696, 697, 700; 174/15.2, 16.3; 415/177, 178, 120
  See application file for complete search history.

(56) References Cited

U.S. PATENT DOCUMENTS 4,885,488 A * 12/1989 Cox ............................ 310/68 R
5,029,236 A *  7/1991 Yasuda et al. .............. 455/575.9

(Continued)

FOREIGN PATENT DOCUMENTS

CA      2375129 A1    12/2000
EP      1650799 A2     4/2006

(Continued)

OTHER PUBLICATIONS

International Search Report for PCT/IB2010/001459 mailed on Oct. 1, 2010 (7 pages).

(Continued)

*Primary Examiner* — Tho V Duong
(74) *Attorney, Agent, or Firm* — Thomas C. Meyers; Brown Rudnick LLP

(57) ABSTRACT

A cooling device (1) comprises a top plate (2), a bottom plate (3), an axial flow inlet (4) in the top plate (2), a rotor support (5) on the top plate (2), and a pump rotor fan (6). The outer dimensions are 40 mm in diameter and 4 mm in height. The internal separation of the plates 2 and 3 is 4 mm. The cooling device (1) has a low profile in scale. Depending on the configuration and on operating parameters steady or unsteady fluid flow vortices can be created in the heat sink. The resulting flow field enhances heat transfer rates locally through impingement cooling and thermal transport by the vortices, whether generated to be steady or unsteady in nature. Also, the vortices drive a secondary flow within the heat sink, effectively creating a pumping mechanism, which further enhances heat transfer. The heat sink is simple, economical to construct and integrate within portable electronics such as mobile phones, and provides the possibility of utilizing existing components and architectures within electronic devices as the heat sink body. For example one or more heat sink surfaces may be surfaces of existing components such as a circuit board or a housing.

19 Claims, 16 Drawing Sheets

(56) References Cited

U.S. PATENT DOCUMENTS

| | | | |
|---|---|---|---|
| 5,304,845 A | 4/1994 | Lindquist et al. | |
| 5,431,216 A * | 7/1995 | Ogushi et al. | 165/122 |
| 5,794,687 A * | 8/1998 | Webster et al. | 165/121 |
| 5,927,393 A | 7/1999 | Richter et al. | |
| 5,979,541 A | 11/1999 | Saito | |
| 6,132,170 A | 10/2000 | Horng | |
| 6,333,852 B1 * | 12/2001 | Lin | 361/697 |
| 6,487,076 B1 * | 11/2002 | Wang | 361/697 |
| 6,509,704 B1 * | 1/2003 | Brown | 318/400.41 |
| 6,579,064 B2 * | 6/2003 | Hsieh | 416/182 |
| 6,587,341 B1 * | 7/2003 | Wei | 361/695 |
| 6,712,129 B1 * | 3/2004 | Lee | 165/104.21 |
| 6,781,835 B2 * | 8/2004 | Hashimoto et al. | 361/697 |
| 6,841,957 B2 * | 1/2005 | Brown | 318/400.01 |
| 6,924,978 B2 * | 8/2005 | DiStefano | 361/688 |
| 7,051,791 B2 * | 5/2006 | Hashimoto et al. | 165/80.3 |
| 7,079,394 B2 * | 7/2006 | Mok | 361/700 |
| RE40,369 E * | 6/2008 | Miyahara et al. | 361/697 |
| 2005/0082035 A1 | 4/2005 | Debashisu et al. | |
| 2005/0161199 A1 | 7/2005 | Ma et al. | |
| 2005/0168953 A1 | 8/2005 | Tsai | |
| 2006/0102324 A1 | 5/2006 | Mok et al. | |
| 2006/0213643 A1 | 9/2006 | Hashimoto et al. | |
| 2007/0160462 A1 | 7/2007 | Tsang et al. | |
| 2008/0017358 A1 | 1/2008 | Hwang et al. | |

FOREIGN PATENT DOCUMENTS

| | | |
|---|---|---|
| GB | 2323921 A | 10/1998 |
| JP | 2006279004 A | 10/2006 |

OTHER PUBLICATIONS

Written Opinion for PCT/IB2010/001459 mailed on Oct. 1, 2010 (10 pages).

International Search Report dated May 7, 2007.

* cited by examiner

COOLING DEVICE

This is a national stage of PCT/IE2006/000129 filed Nov. 17, 2006 and published in English.

INTRODUCTION

1. Field of the Invention

The invention relates to cooling devices for applications such as cooling circuits of mobile phones. The invention relates particularly to radial cooling devices, in which fluid enters axially and exits radially.

2. Prior Art Discussion

In the semiconductor industry high temperatures of components threaten reliability and may compromise user comfort (such as in mobile electronics). Cooling devices employing forced convection have been employed to reduce operating temperature.

Heat sinks typically consist of a number of heat transfer surfaces, commonly named fins. Various techniques have been employed to enhance fin heat transfer efficiency, such as staggering the fins, and modifying manufacturing techniques to improve heat transfer through increased fin density. The presence of the fins results in an increase in heat transfer surface area and hence higher levels of heat transfer for a given mass flow. However the fins also induce shear losses leading to higher pressure losses, which ultimately reduces the mass flow rate through the heat sink and the hence the potential for heat transfer for a given pressure drop across the heat sink.

It is known to use nozzles to generate jets which impinge upon a heated surface for impingement cooling is. However this provides significant difficulties which include nozzle back pressure, acoustic emissions, and practical limits due to enclosure size and design.

U.S. Pat. No. 5,304,845 describes an approach using small ribs to in an inverted V-shape to generate impingement zones. The ribs intersect the flow of fluid through the heat sink.

U.S. Pat. No. 5,927,393 describes use of corrugations in a heat exchanger for blending air passing between adjacent fins.

These approaches involve use of intricate physical structures in the heat sink or heat exchanger to achieve improved heat transfer. Such structures are difficult and costly to manufacture, particularly at small scales for applications such as mobile phones.

The invention is directed towards providing an improved cooling device to overcome at least some of the above problems.

SUMMARY OF THE INVENTION

According to the invention, there is provided a cooling device comprising a fluid pump having a cooling device inlet and a heat sink having a cooling device outlet, the pump comprising means for receiving fluid in an axial direction through said inlet and for pumping it radially through the heat sink, and wherein the heat sink comprises a heat transfer surface.

In one embodiment, the heat sink defines a volume without heat dissipation fins extending from a heat sink inlet facing the pump and the device outlet is on a side opposed to the heat sink inlet in the radial direction.

In one embodiment, the heat sink comprises a pair of opposed heat transfer surfaces spaced apart in the axial direction.

In one embodiment, the ratio of the radial dimension of the heat sink between the heat sink inlet and the device outlet to the axial dimension of the heat sink and the configuration of the pump are such that thermal boundary layers that grow on the heat transfer surfaces meet at the device outlet.

In one embodiment, the separation of the heat transfer surfaces in the axial direction and the length of the pump in the axial direction are in the range of 1 mm to 10 mm.

In one embodiment, said separation and said length are less than 5 mm.

In one embodiment, the heat transfer surfaces are substantially parallel.

In one embodiment, the heat sink comprises at least two plates spaced-apart in the axial direction, inner surfaces of the plates being the heat transfer surfaces.

In another embodiment, the heat sink further comprises heat-conducting support pillars interconnecting the plates.

In one embodiment, the plates are disc-shaped.

In one embodiment, a plate has an aperture providing the device inlet.

In one embodiment, the aperture is centrally located in the plate.

In one embodiment, the pump comprises means for directing air into the heat sink with a tangential velocity component of flow sufficient to cause at least one fluid flow vortex to form in the heat sink.

In one embodiment, the pump and the heat sink comprise means for forming vortices which drive secondary pumping of fluid.

In one embodiment, the pump and the heat sink are configured so that vortices become a primary pumping mechanism if the device inlet is blocked.

In one embodiment, the pump comprises rotor blades, and the angles of the blades are such as to cause a fluid flow exit angle $\theta$ in the range of 40° to 90°.

In one embodiment, the pump and the heat sink comprise means for forming steady, time-invariant, vortices within the heat sink.

In one embodiment, the pump and the heat sink comprise means for forming unsteady, time-varying, vortices within the heat sink.

In one embodiment, the heat sink comprises a heat transfer annular fin surrounding the pump and between the opposed plates.

In one embodiment, the device further comprises a duct for entry of air to the device by flowing radially inwards over the heatsink and then axially into the pump.

In one embodiment, the heat sink comprises fins within a heat sink volume.

In one embodiment, the fins are curved in a non-radial configuration to have a gradually decreasing tangential component with increasing distance from the fan axis for at least some of their length.

In one embodiment, a dimension in the axial direction of the heat sink is of the same order of magnitude as the spacings between fins.

In a further embodiment, leading edges of the fins are spaced apart from the pump in the radial direction sufficient to allow formation of fluid flow vortices in the heat sink volume between the pump and the fins.

In one embodiment, the fins comprise a plurality of long fins and interleaved shorter first construct fins.

In one embodiment, the first construct fins are adjacent to the device outlet.

In one embodiment, the heat sink includes a circuit board of a circuit to be cooled, said circuit board providing a heat transfer surface.

In one embodiment, the heat sink includes a wall of a housing of a portable electronics or communications device to be cooled, said wall providing a heat transfer surface.

In one embodiment, the pump comprises stationary vanes and a fluid blower for directing fluid at the vanes.

In another aspect, the invention provides a portable electronics device comprising any cooling device as defined above.

In a further aspect, the invention provides a mobile phone comprising any cooling device as defined above.

In another aspect, the invention provides a method of cooling an electronic circuit, the method comprising the steps of a pump pumping air radially from a pump axis with a tangential component of air velocity so that at least one fluid flow vortex is generated which impinges on the circuit without use of fluid guidance fins or baffles or ribs.

In one embodiment, the tangential component of the air velocity is such that steady vortices of air impinge on the circuit.

In one embodiment, the tangential component of the air velocity is such that unsteady vortices of air impinge on the circuit In one embodiment, the pump has an axial dimension of less than 10 mm, and the pump is mounted within a casing for the circuit.

In one embodiment, the air is pumped so that a plurality of vortices are formed adjacent the circuit board, each vortex having a toroidal shape surrounding the pump.

DETAILED DESCRIPTION OF THE INVENTION

Description of the Embodiments

The invention will be more clearly understood from the following description of some embodiments thereof, given by way of example only with reference to the accompanying drawings in which:—

DESCRIPTION OF THE EMBODIMENTS

Finless Cooling Device

Figure 1:
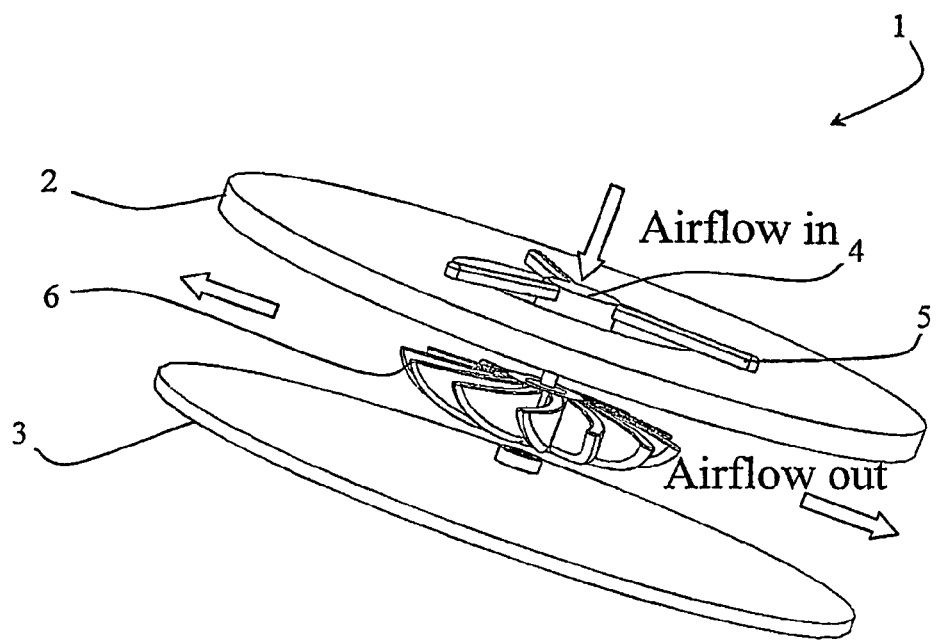
FIG. 1 is a perspective view of a cooling device of the invention.

Referring to FIG. 1, a cooling device 1 is illustrated. For clarity, the components in the drawings are not to scale. The cooling device 1 is of copper material, and comprises a top annular plate 2, a bottom disc-shaped plate 3, and an axial flow inlet 4 in the top plate 2. There is a rotor support 5 on the top plate 2, supporting a pump rotor 6. The rotor support 5 is in a device inlet for axial flow into the rotor 6. The plates 2 and 3 together form a heat sink, however it does not need fins between the plates. The device outlet is the gap between the plates 2 and 3 around their full circumference.

The device 1 has a dimension of 40 mm in diameter and the internal separation of the plates 2 and 3 is 4 mm. The angle of the rotor blades (defined below) at the tips is 55°. The plates 2 and 3 are interconnected by heat-conducting pillars, not shown.

The cooling device 1 has a low profile in scale. Depending on the rotor and heat sink configuration and on operating parameters, steady or unsteady fluid flow vortices are created in the heat sink without need for physical structures within the heat sink. By "unsteady", we mean that the vortices at a particular location of the heat sink change with time. The resulting flow field enhances heat transfer rates locally through impingement cooling and thermal transport by the vortices, whether generated to be steady or unsteady in nature. Also, the vortices drive a secondary flow within the heat sink, which entrains fluid at the outlet, and draws it into the heat sink, effectively creating a secondary pumping mechanism which further enhances heat transfer.

The heat sink is simple, economical to construct and integrate within portable electronics such as mobile phones, and provides the possibility of utilizing existing components and architectures within electronic devices such as a circuit board. For example, one or more heat sink surfaces may be surfaces of existing components such as a circuit board or a housing, avoiding need for one or both of the plates. The fact that physical heat sink structures are not required to generate vortices in the fluid flow allows excellent versatility and simplicity, particularly for compact devices.

The cooling device 1 is configured to exploit the fact that the boundary layers which grow at the upper and lower bounding surfaces of a low profile heat sink 2 and 3 meet at the air outlet if the plates are close enough together. The cooling performance of the finless heat sink is of the same order of magnitude as a finned heat sink. At smaller spacings the finless heat sink outperforms a finned heat sink of similar overall dimensions. In this example, the separation of 4 mm is less than double the boundary layer thickness. Furthermore, in addition, the air is pumped by the rotor 6 in a manner to create vortices between the plates 2 and 3, further contributing to heat transfer.

Figure 2:
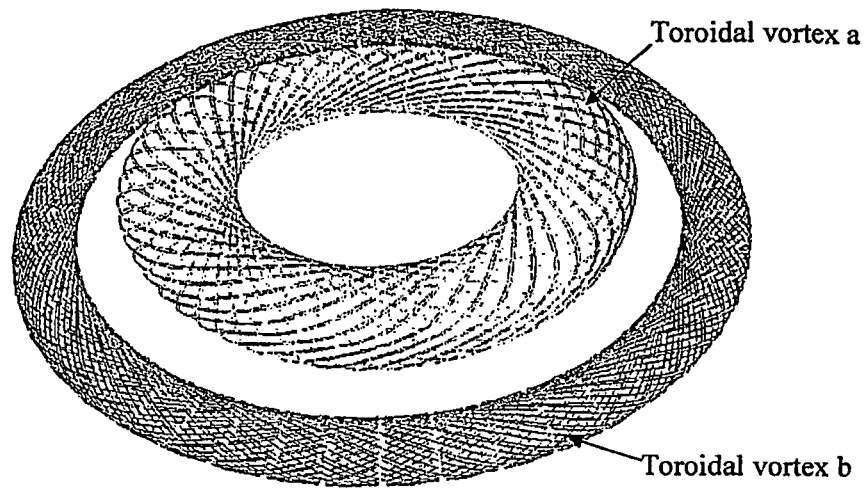
FIGS. 2 to 4 are diagrams illustrating vortices in air flow within a heat sink of the cooling device.

In more detail, FIG. 2 shows Fluent-predicted concentric toroidal vortices "a" and "b" downstream (in the radial direction) of the rotor. In this case the aspect ratio allows two vortices. The aspect ratio is the ratio of the heat sink radial dimension to the heat sink axial dimension (plate separation). The larger the aspect ratio, the greater the number of vortices.

Figure 3:
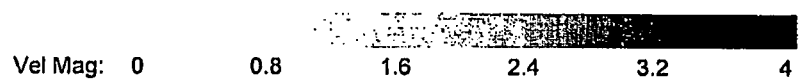
Figure 3:
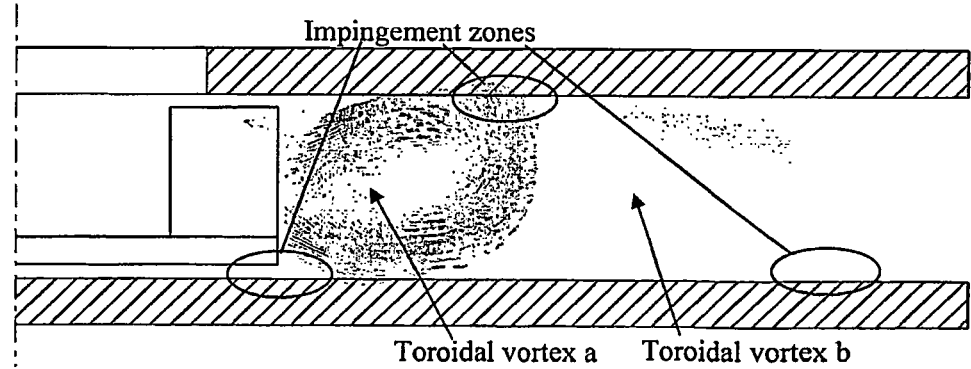
Figure 4:
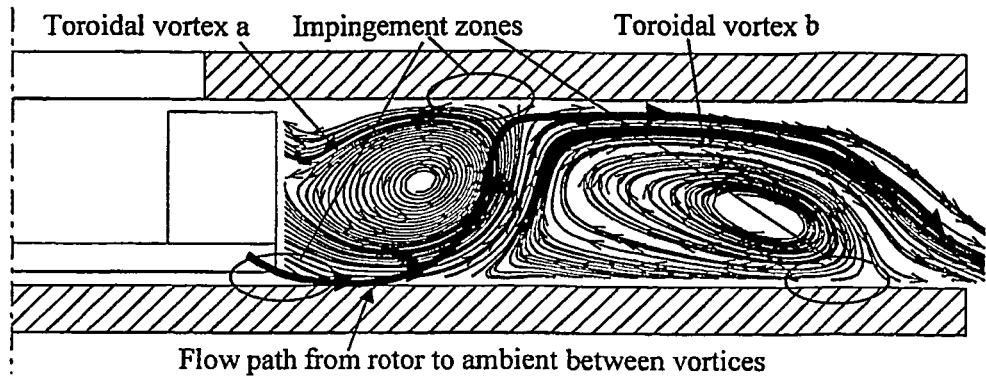

FIG. 3 shows PIV measurements between the plates 2 and 3, showing the vortices "a" and "b" of FIG. 2 and impingement regions at the heat transfer surfaces of the plates 2 and 3. FIG. 4 shows streamlines obtained from PIV measurements, again clearly showing vortices and impingement regions. This also shows flow paths between the vortices and between the vortices and the plates.

Figure 5A:
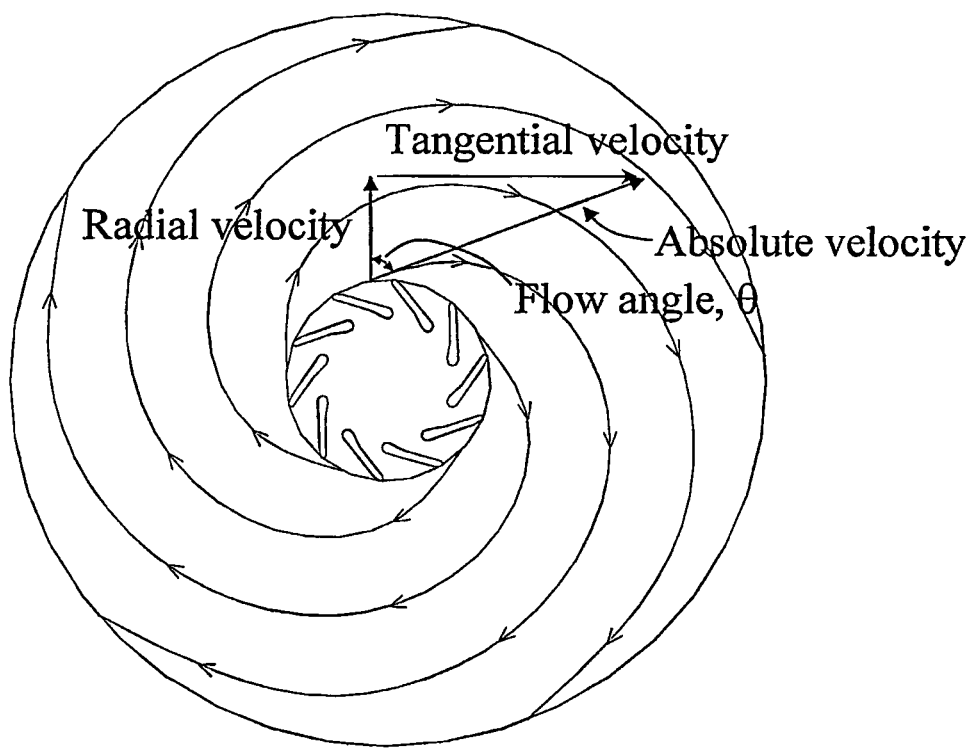
FIG. 5(a) is a diagrammatic plan view showing the direction of air flow from a rotor pump, and indicating the exit angle θ.
Figure 5B:
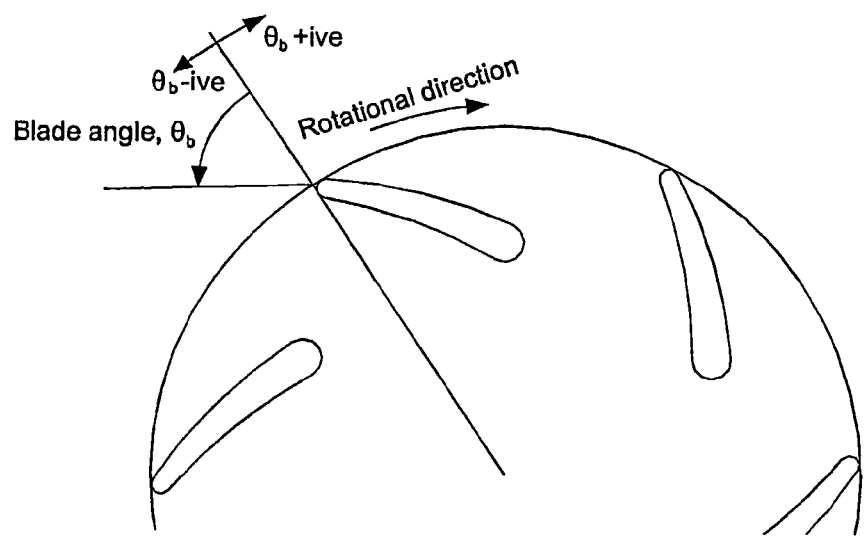
FIG. 5(b) is a diagrammatic plan view showing the rotor blade angle $θ_b$.
Figure 5C:
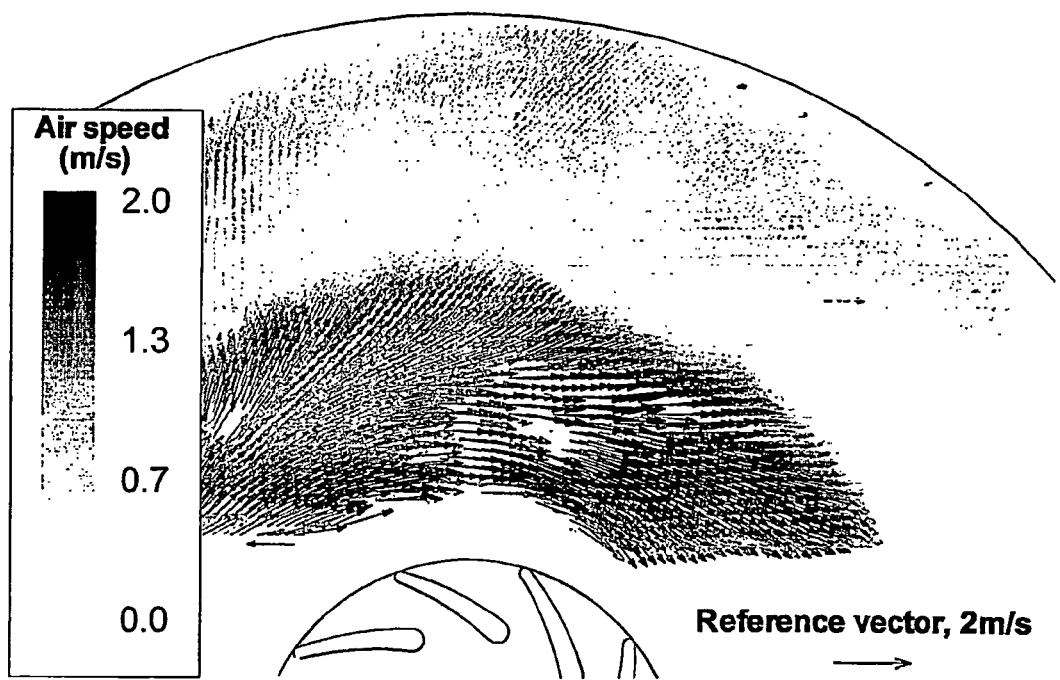
FIG. 5(c) is a PIV measurement of air flow, in which there are two vortices.

FIG. 5(a) shows a plan view of the flow structures in a finless heat sink indicating exit angle θ of air from the ends of the blades. The exit angle is the angle of a vector representing velocity of air from the blades, measured from −90° to 90°. For generation of air flow vortices in the heat sink the rotor blades have a tip angle $\theta_b$ indicated in FIG. 5(b) of −50° to 90°, more preferably 0° to 80°, more preferably 45° to 60°, and most preferably 52° to 56°. The blade inlet angle should be such that the angle of incidence of flow onto the blade is minimised. FIG. 5 (c) shows air speeds for the vortices.

It is preferred that the exit angle θ is greater than 40°.

Figure 6:
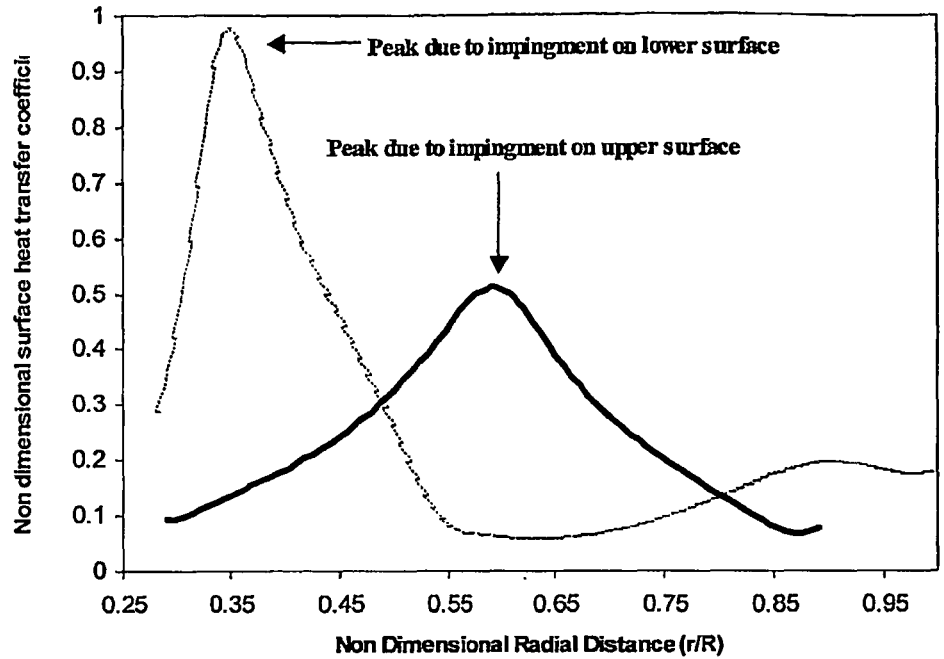
FIG. 6 is a plot showing a prediction of heat transfer variation with distance from the rotor axis, r being distance and R being the maximum value of r.

FIG. 6 shows surface heat transfer coefficient distribution along the finless heat sink showing regions of enhanced heat transfer due to the impingement cooling caused by the vortices.

The vortices illustrated in the above diagrams enhance heat transfer because they result in flow impingement, thermal mixing, and unsteadiness.

Figure 7:
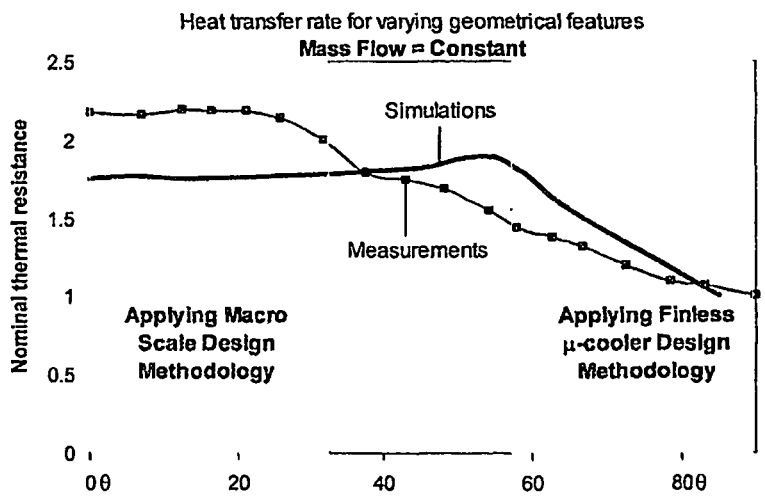
FIG. 7 is a set of plots showing nominal thermal resistance vs. exit angle θ of velocity of air from rotor blades.
Figure 8:
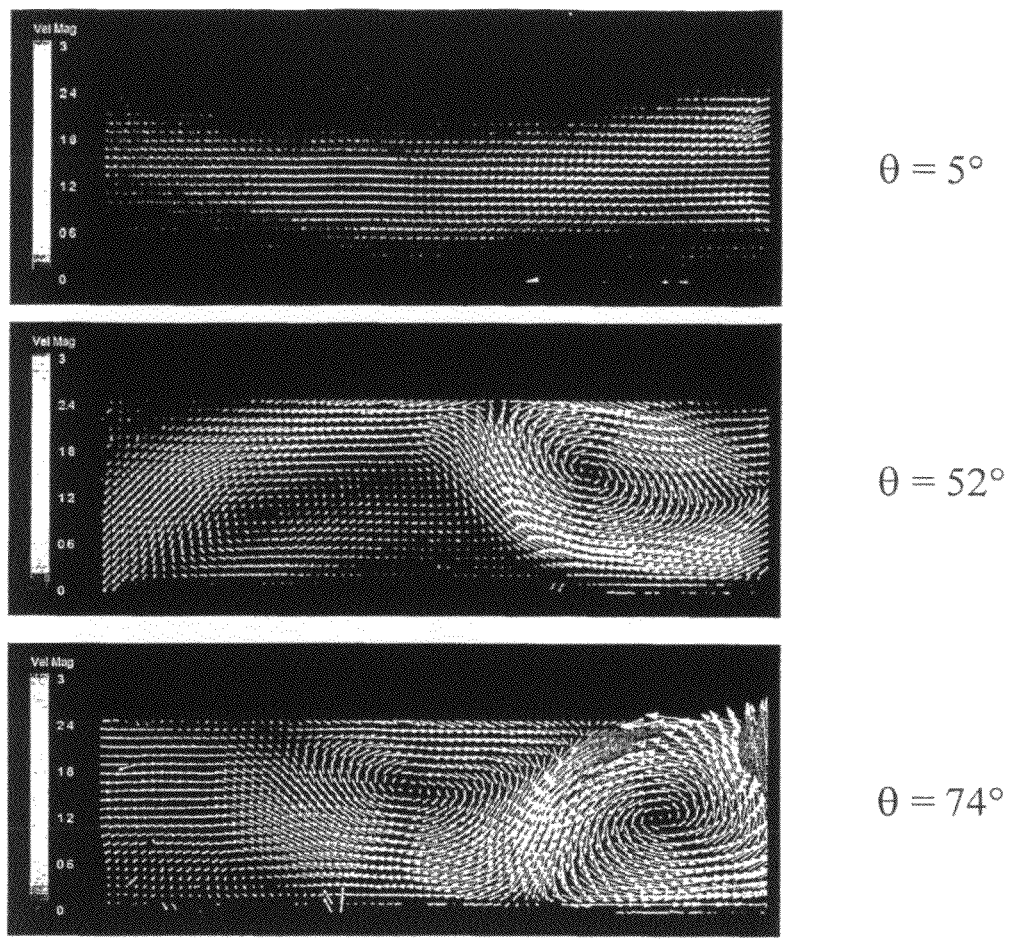
FIG. 8 is a set of PIV measurements showing swirling air flow as a function of exit angle θ.

The existence of vortices was confirmed through PIV measurements over a range of velocities, flow angles, and heat sink scales. It has further been identified that an enhanced heat transfer is achieved through increasing the tangential component of the exit angle, even with the net mass flow held constant. This is shown in FIG. 7, where values of θ greater than 40° were found to be favorable at providing increased heat transfer, through the existence of vortices. Higher angles produced higher strength vortices, thereby enhancing the heat transfer rate further. FIG. 7 shows this effect in detail where the net mass flow through the heat sink remains constant and the intensity of the vortex increases with increasing tangential flow velocity. FIG. 8(a) (the top diagram) represents the case where the flow is radial. Once a significant tangential component is added to the exit flow vortices are created (FIG. 8(b), centre), and further enhancements in vortex strength are found when the tangential component is increased further, FIG. 8 (c) (bottom).

Figure 9:
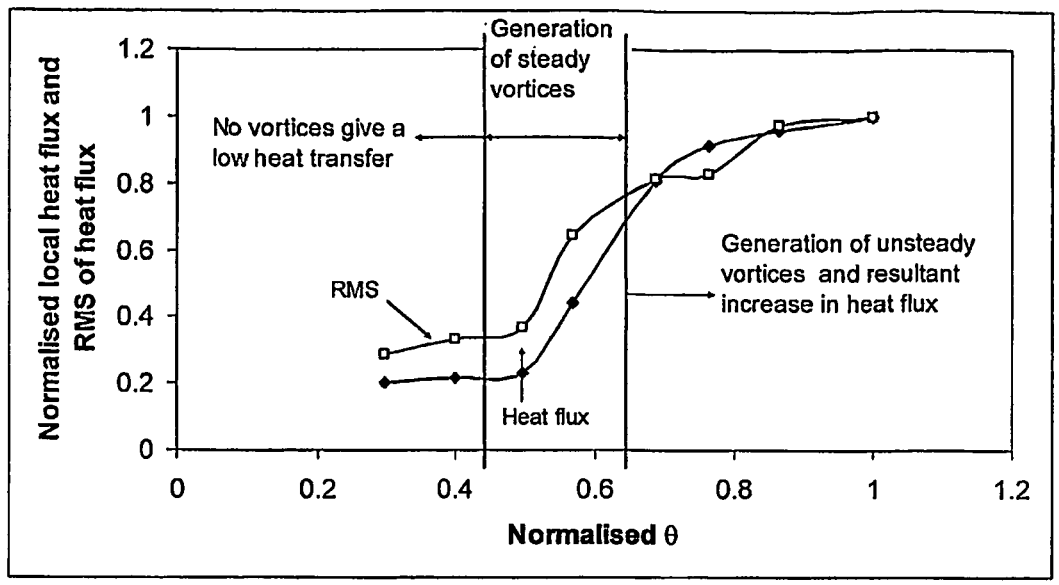
FIG. 9 is a set of plots showing normalised local heat flux and unsteadiness vs. normalised exit flow angle, in which three phases of air flow are illustrated.
Figure 10:
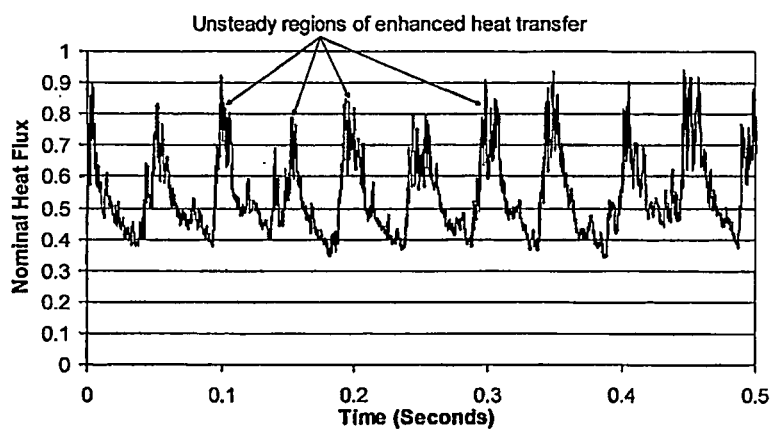
FIG. 10 is a plot of nominal heat flux vs. time to illustrate unsteady vortex generation.

The direct effect on local heat transfer is illustrated in FIG. 9 where the relative local heat flux was measured with varying exit angle and an increase in local heat flux is observed. These plots show the transitions from no vortices to steady vortices and from steady vortices to unsteady vortices. If there are steady vortices, they may be positioned at particular locations for optimum heat transfer, or for example at a heat pipe. On the other hand unsteady vortices spread the heat transfer radially out across the full heat sink in the time domain. This is shown in FIG. 10

Figure 11:
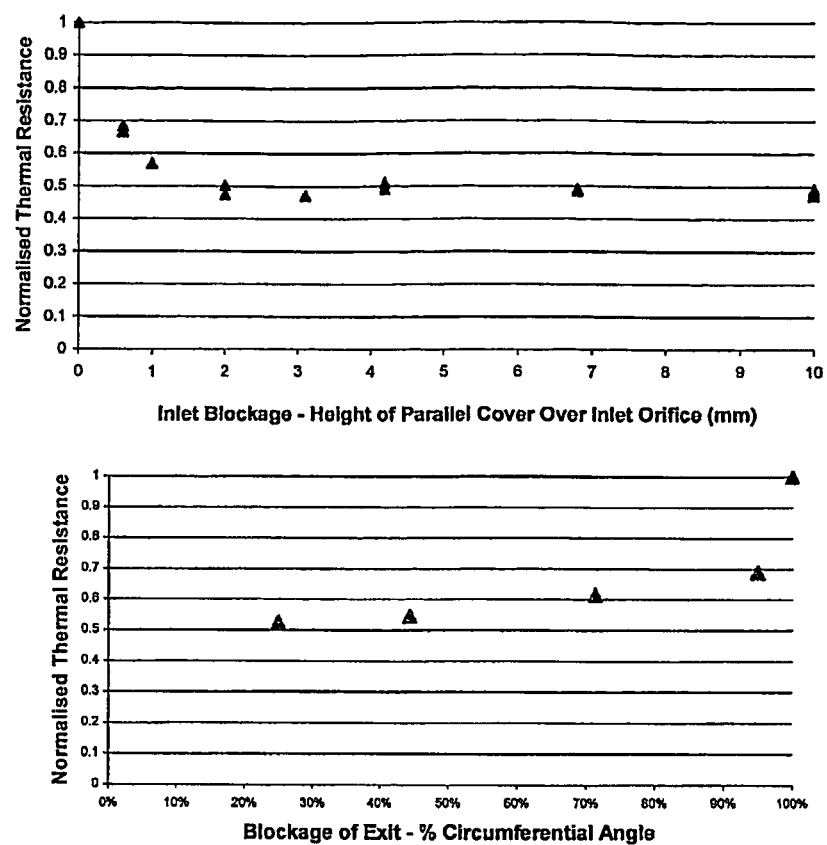
FIG. 11 is a pair of plots showing relationships between normalised thermal resistance and inlet blockage and exit blockage.

The heat sink also demonstrates favourable properties in terms of blockage, which is a key feature for portable devices such as mobile devices as a user's hand may easily block a vent opening. FIG. 11 demonstrates that approximately 70% of the exit flow area may be blocked with only minimal effect on heat transfer rate, a similar effect being noted for both inlet and outlet blockage. In standard heat sink arrangements any blockage will result in reduced heat sink thermal performance. Furthermore with complete exit blockage, the heat sink still performs well because, although the net through flow is zero, fluid is drawn into the heat sink, circulated, and expelled from the heat sink. On the contrary, in the case of a prior art combined fan and heat sink combination the heat transfer due to the forced convection would reduce to almost zero. Also, the device of the invention can exit the heat sink through 360° of the outlet perimeter, whereas prior devices only typically have 90°, i.e. blockage of one side of a mobile phone for example renders the thermal management solution redundant.

The vortices provide a secondary beneficial effect to the heat transfer rates by causing an effective pumping mechanism in addition to that caused by the fan. Air is entrained into the vortices and expelled, thereby adding to the net heat transfer rate. The cooling device 1 enhances heat flux in a given volume and is particularly appropriate for low profile applications such as mobile phones. The avoidance of fins from heat sink structures makes them easier and cheaper to manufacture, and presents the possibility of using an existing architecture within mobile electronic devices as the heat sink surface, thereby allowing a simplified integration. Indeed the cooling device of the invention may comprise a fan and means for mounting the fan so that the heat sink is provided by components which exist anyway, such as a circuit board or a housing wall. The avoidance of finned heat sinks reduces weight and also results in reduced aerodynamics noise. Also, the pressure drop across the heat sink is less as there is less surface area to add to the viscous drag. Further, the vortices may be generated in small volumes. Also, enhanced localised heat in regions of high heat transfer rates presents the possibility for integration with other cooling devices.

Figure 12:
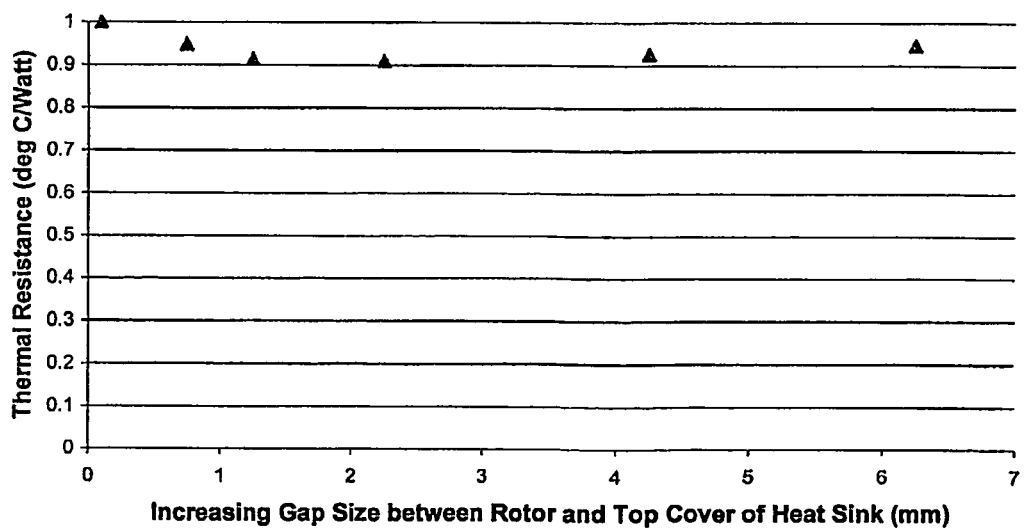
FIGS. 12 to 15 are plots of thermal resistance as a function of various cooling device parameters.
Figure 13:
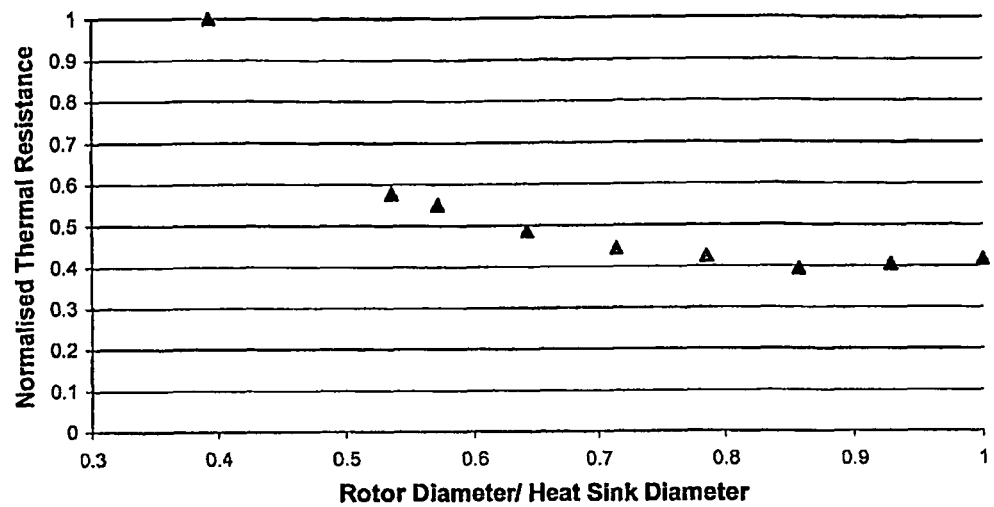
Figure 14:
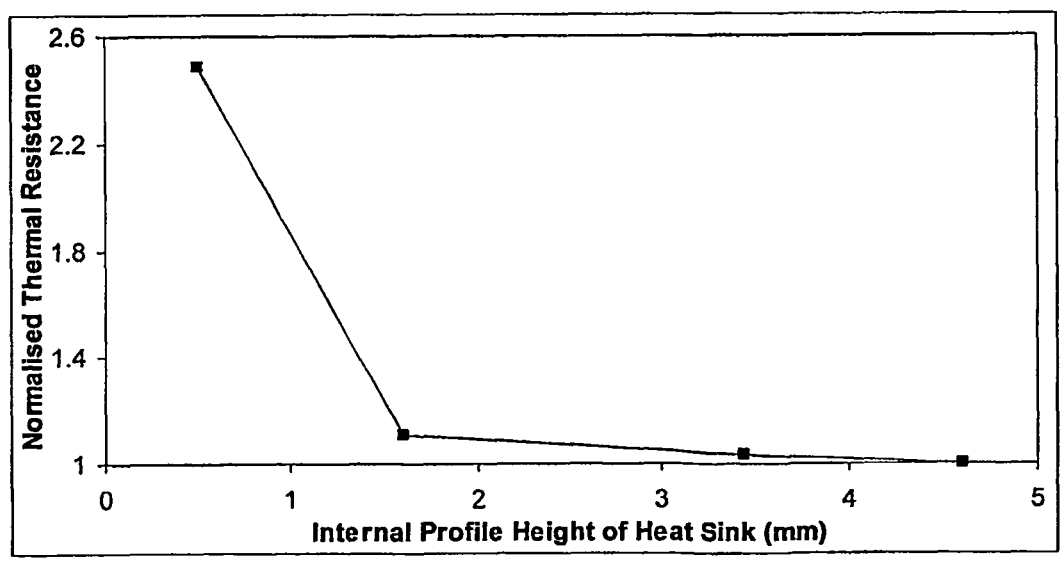
Figure 15:
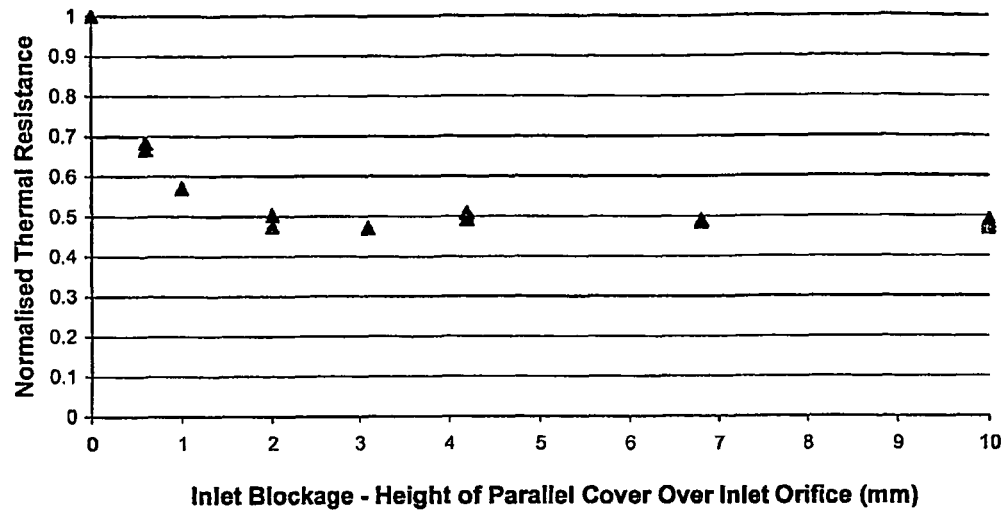

Some advantageous aspects of the invention are illustrated through measurement in FIGS. 12 to 15. FIG. 12 demonstrates that the distance between the cover plate and the fan is unimportant and only has a minor effect on overall heat transfer of the invention, although the proportion of heat from the top and bottom of the heat sink does vary. FIG. 13 demonstrates the effect of changing the size of the rotor on the overall heat transfer coefficient. As the rotor diameter approaches the same dimension as the heat sink diameter, the vortex impingement regions are reduced and hence only small gains in heat transfer are achieved, despite the need for increased power to run the rotor. FIG. 14 shows the result of varying the overall height of the heat sink, where the fan profile is reduced. This result illustrates that the heat sink profile can be more than halved with only a 20% loss in overall heat transfer. This result is particularly relevant for low profile portable electronics such as mobile phones. FIG. 15 illustrates the effect of placing a cover over the fan inlet at different heights as would be necessary in a mobile phone.

Figure 16:
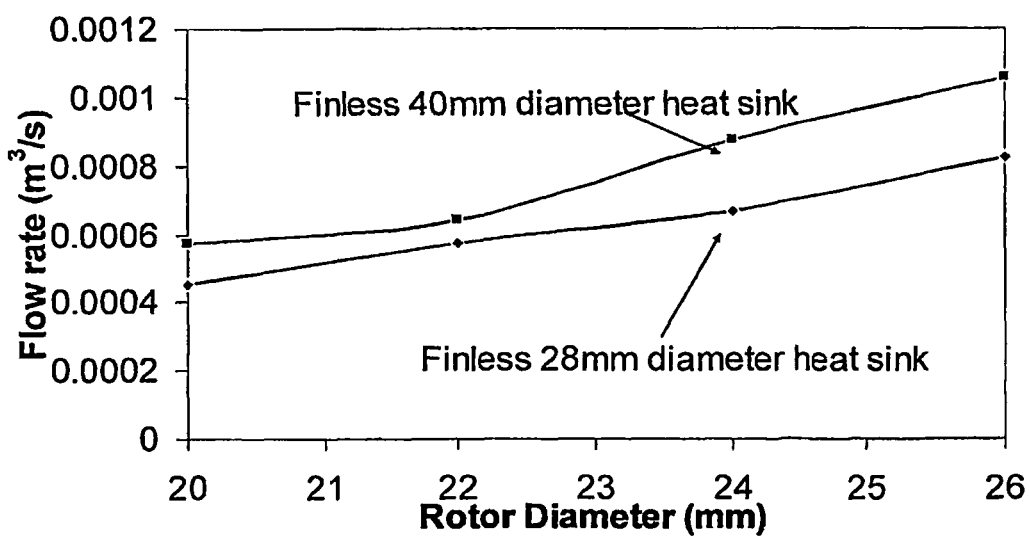
FIG. 16 is a plot of air flow rate vs. rotor diameter.

FIG. 16 illustrates that increasing the diameter of the finless heat sink results in an increased mass flow rate rather than the reduction which would be expected. This will contribute to an increased heat flux at larger heat sink sizes.

Figure 17:
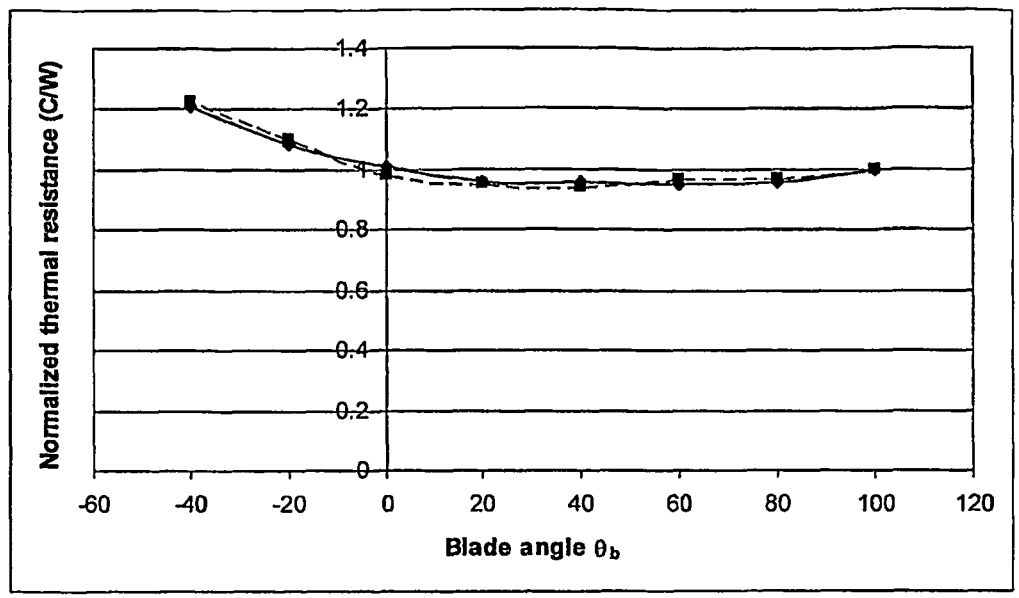
FIG. 17 is a plot of thermal resistance vs. blade angle $θ_b$.

FIG. 17 illustrates exit rotor angle effect on thermal resistance. Operating the fan in forward curved direction with rotor blade angles of between 20° and 70° at the tips gives the best result, with an almost constant thermal resistance. This was found for heat sinks of different sizes as can be seen from the two curves for a 24 mm and 40 mm heat sink.

Figure 18:
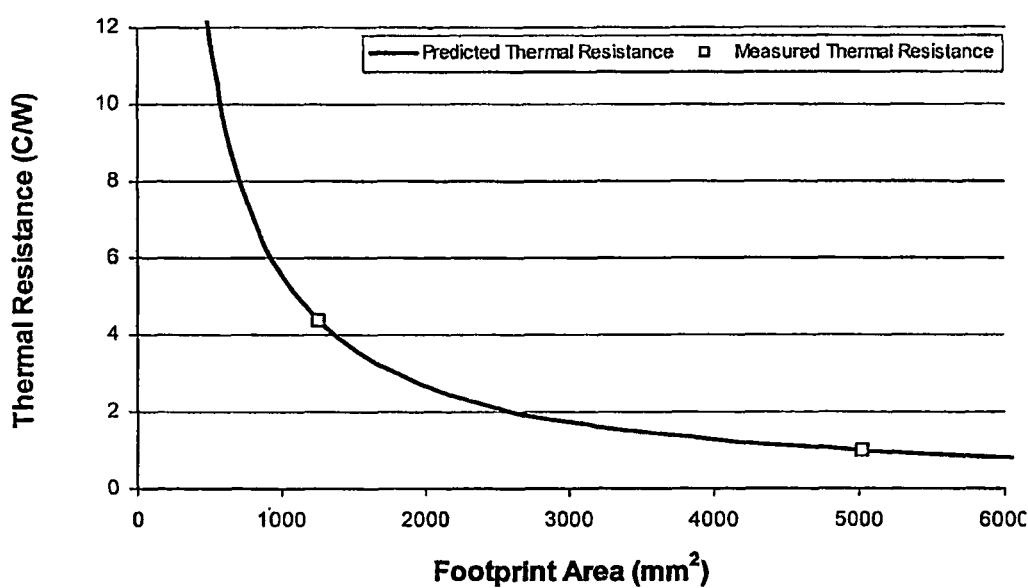
FIG. 18 is a plot of thermal resistance vs. cooling device footprint area.

FIG. 18 shows thermal resistance vs. footprint area of finless heat sink (rotor is 75% of heat sink diameter and speed is 3000 RPM). Thermal resistance is inversely proportional to footprint size.

Figure 19:
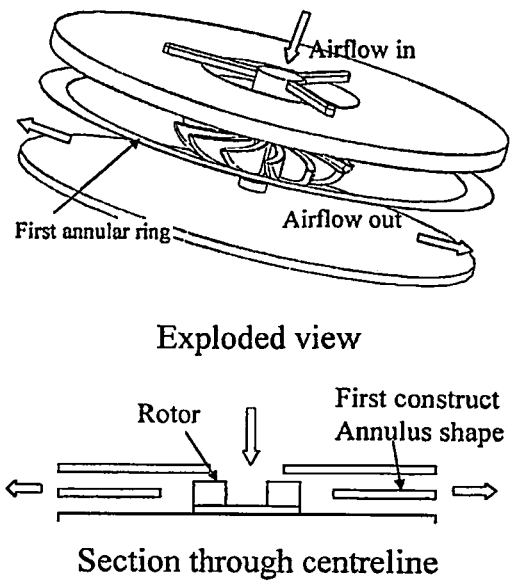
FIG. 19 shows perspective and side views of an alternative cooling device.

FIG. 19 shows an alternative finless cooling device, having an annular fin construct parallel to the top and bottom plates.

This allows the vortex to impinge upon additional surface areas without prohibiting the vortex formation, as a conventional radial fin would do. Furthermore, the pressure loss imposed by the annular fin is small as the fin is located at a large radius, where the velocity is relatively low.

Figure 20:
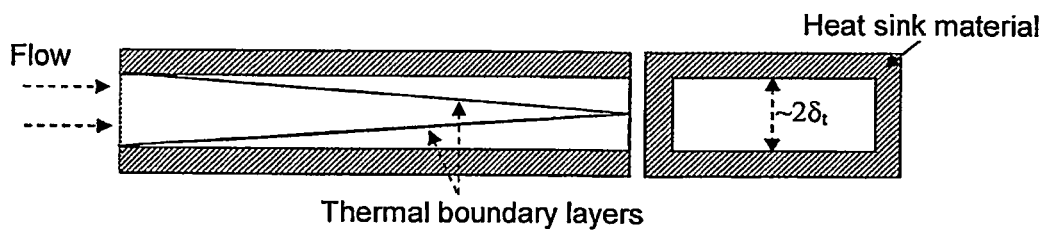
FIG. 20 shows side (left diagram) and end (right diagram) cross-sectional views of a heat sink of a further cooling device of the invention.

FIG. 20 shows a further heat sink for a cooling device. In this case top and bottom plates are separated by approximately double the boundary layer thickness.

Finned Cooling Devices

Figure 21:
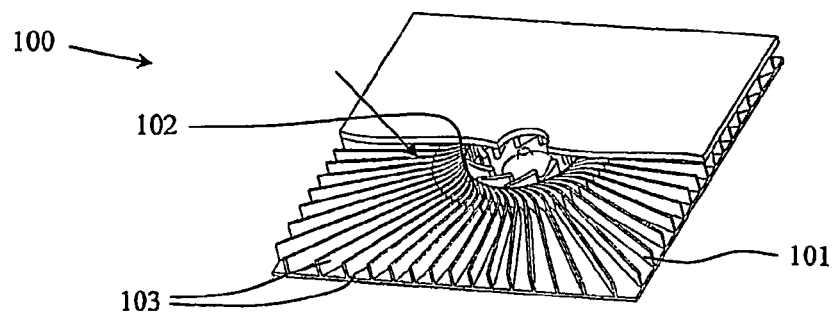
FIG. 21 is a perspective view of a cooling device having a heat sink with fins.
Figure 22:
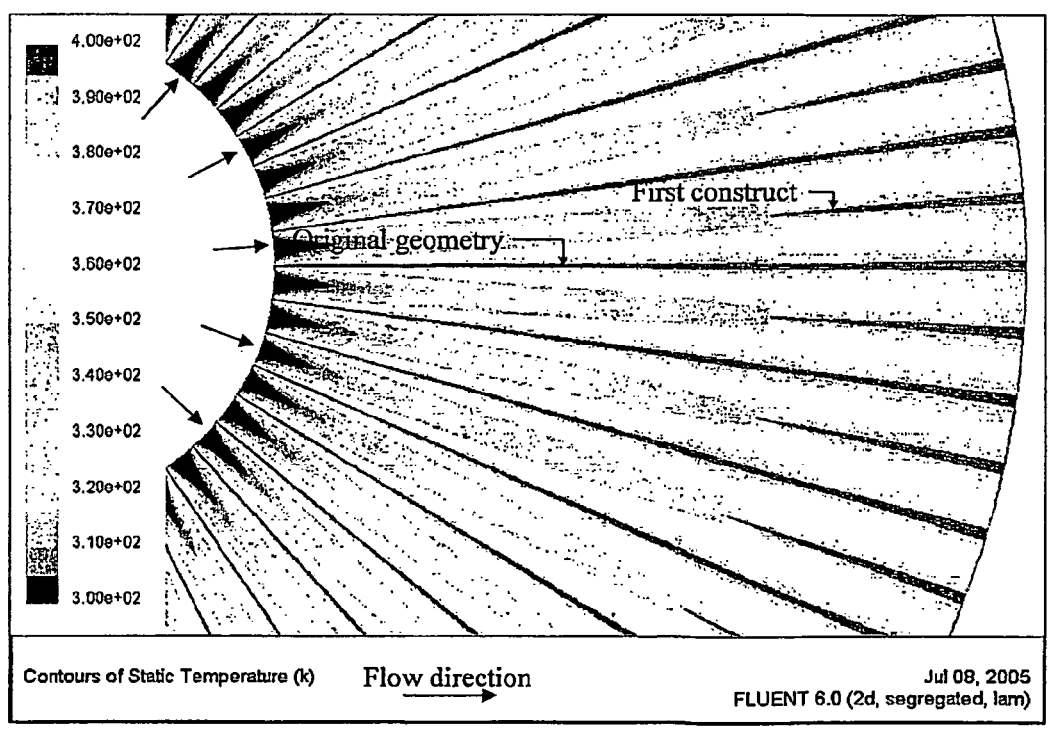
FIG. 22 is a diagram illustrating temperature predictions for a further cooling device with fins in the heat sink.

Referring to FIGS. 21 and 22 a cooling device 100 comprises a heat sink 101 and a rotor 102 driven by a bearing and a drive system (not shown). The heat sink 101 is constructed from a high conductivity material namely copper, and forms a conductive path from the heat source to multiple cooling fins 103 that extend generally radially from the centre out towards the extremities. The rotor 102 is located at the centre of the heat sink such that the blades of the rotor are in the same planes as the cooling fins 103. By using a motor to rotate the rotor, air is taken axially from the ambient and forced radially along the surfaces of the heat sink fins 103, as illustrated.

The fins 103 have two functions. Firstly, as described above they act as heat sinks, and secondly they play an aerodynamic role, deflecting the flow from the tangential direction to the radial direction, thus decelerating the flow, recovering static pressure, and enhancing the aerodynamic performance of the fan rotor. Because of the tangential component of air flow from the fan blades, the fins are curved and hence longer for a given radial distance from the axis.

The use of multi-scale features (different types of fins) in heat sinks can be used to improve the performance of the heat sinks. However the application of multi-scale features to radial flow heat sinks is complicated by the fact that the flow is decelerated in the flow direction. Numerical simulations have shown that for radial flow configurations, the best location for the fin of second largest dimension, hereafter referred to as the "first construct" is at the outlet of the heat sink, as illustrated in FIG. 22. This is in contrast to the conventional case of parallel plate heat exchangers where there is no deceleration of the flow and the first constructs are placed at the upstream end of the heat sink. The numerical simulations illustrated in FIG. 22 show that the multi-scale features (main fins called "original geometry" and smaller, outer fins called "first constructs") give heat transfer gains of approximately 10% over an optimized radial flow heat sink which does not employ multi-scale features.

Figure 23:
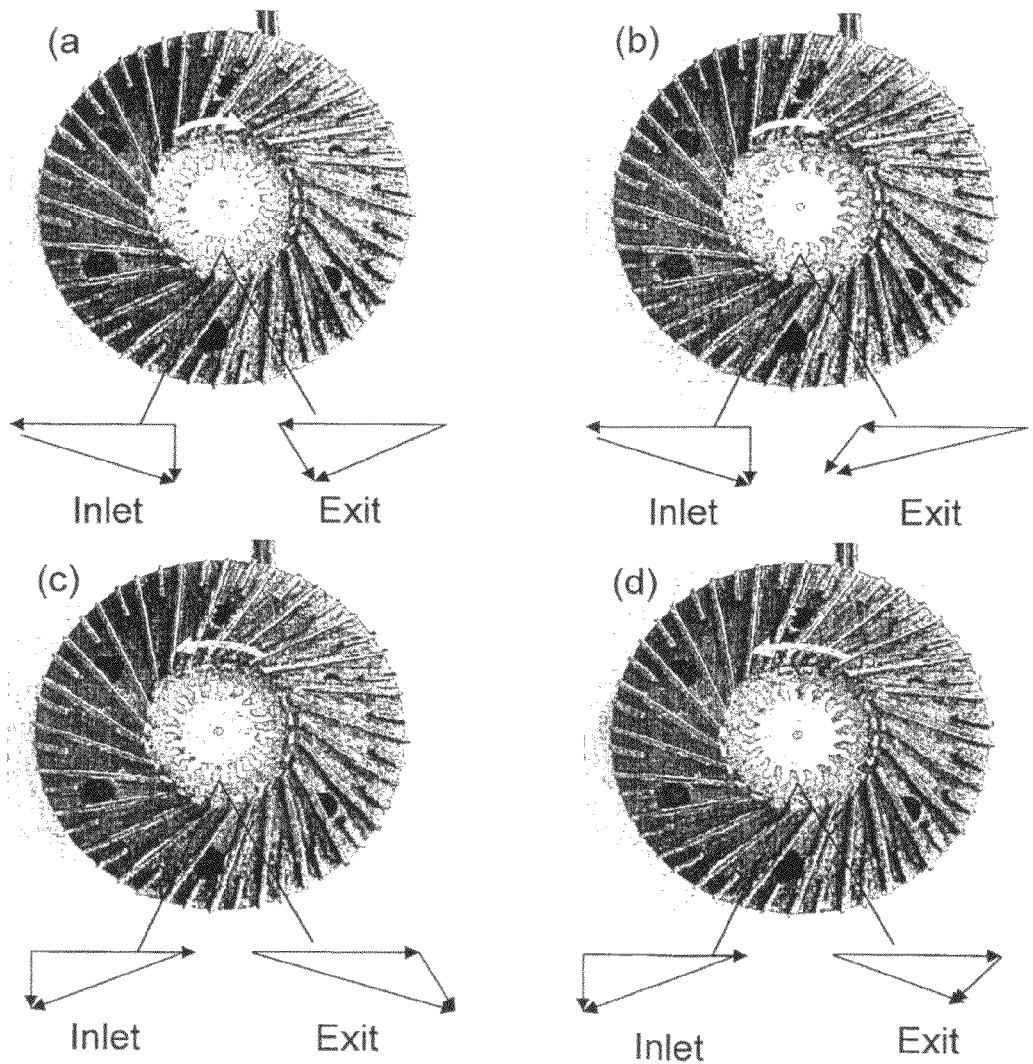
FIGS. 23(a) to 23(d) are plan views of finned heat sinks and FIGS. 24 to 26 inclusive are plots showing performance of these heat sinks.

FIG. 23 shows inlet and exit velocity triangles of four tested fin configurations. The arrow over the rotor represents the rotational direction in each case. The images and/or velocity triangles are not to scale and are for visualisation purposes only. This shows the importance of fan design and heat sink integration. The curved fins on the heat sink are particularly beneficial when the flow is in the configuration of case (b), having first and second constructs. The main differences between the four arrangements are described in Table 1.

TABLE 1

Summary of flow configurations tested for each exit flow angle.

| Case | Inlet flow angle design | Interaction with fins at exit |
|---|---|---|
| A | High incidence angle | Matched to fin angle |
| B | Low incidence angle | Matched to fin angle |
| C | Low incidence angle | Impingement on fins |
| D | High incidence angle | Impingement on fins |

Figure 24:
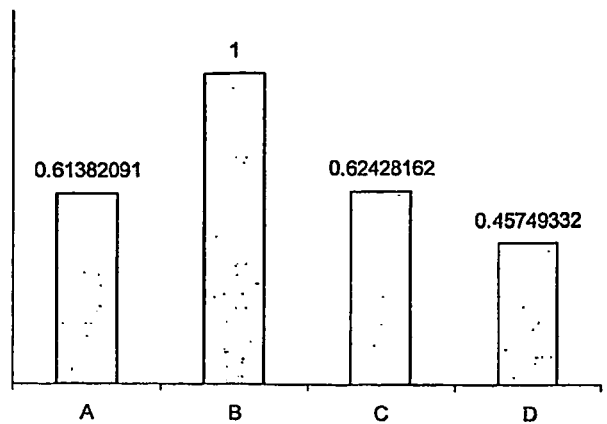
Figure 25:
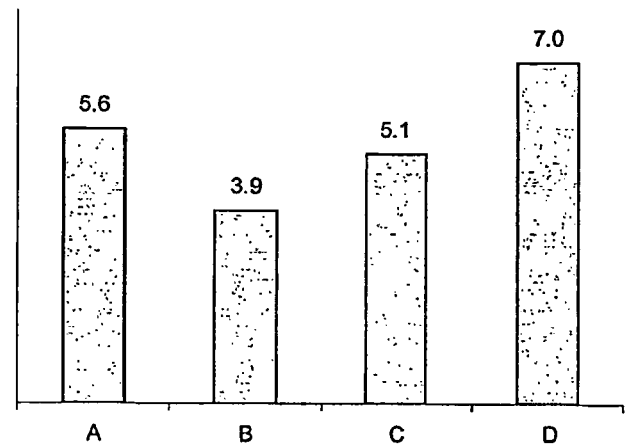
Figure 26:
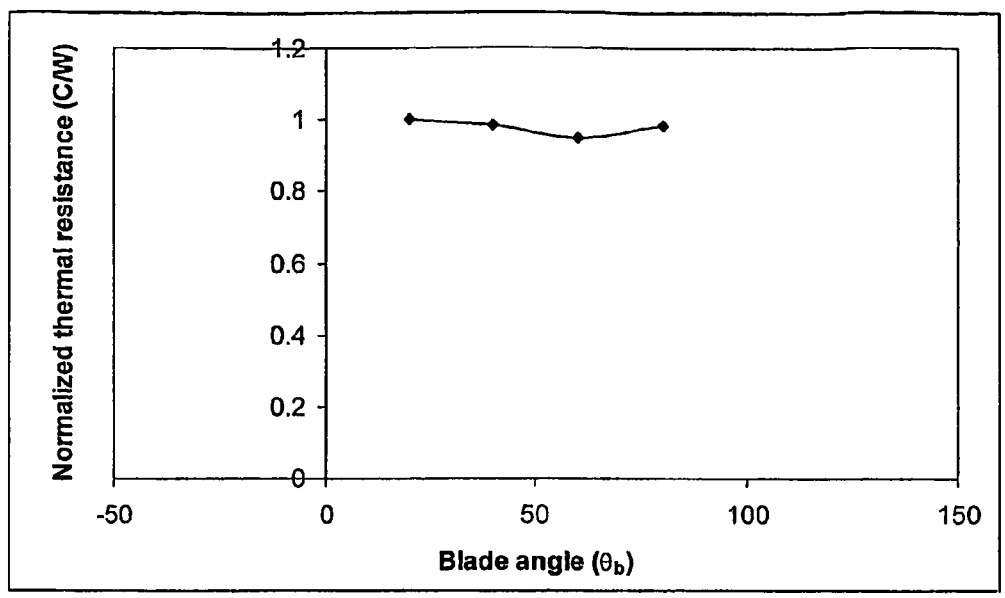

FIG. 24 shows relative volumetric flow rate for the thermal resistance cases A to D labelled in FIGS. 23(a) to 23(d) respectively. This shows the enhanced flow rates achieved for the four configurations tested in FIG. 23(a) to 23(d). FIG. 25 shows thermal resistance in ° C./W for the thermal resistance cases. This shows the thermal resistance values achieved in the four configurations. FIG. 26 illustrates the insensitivity of blade angle when design is in optimum configuration shown in FIG. 23(b) above. Flow is best when exit angle matches fin angles but for angles close to this only little deviation is found.

It will be appreciated that the invention provides cooling devices which are very effective and compact, and so are ideally suited to applications such as mobile phones and laptop computers.

The invention is not limited to the embodiments described but may be varied in construction and detail. For example, the plates need not necessarily be parallel, and need not be disc-shaped. Also, the pump may not have rotating blades. It may instead comprise stationary blades toward which air is forced by a separate air blower. Such an external air blower may deliver air to a bank of multiple cooling devices having stationary blades. Also, a cooling device having a heat sink with fins may have the fins located sufficiently far from the axis so that vortices form in the empty space between the blades and the fins. Further the cooling device may be configured to operate with a fluid other than air, such as liquid coolant. Also, the internal dimension of the heat sink may be of any value up to about 10 mm, to achieve a low profile configuration. While in the embodiments above the cooling device material is copper, it may be of any other suitable material depending on cooling specification and manufacturing criteria. Also, a cooling device of the invention may further comprise a duct for entry of air to the device by flowing radially inwards over the heat sink and then axially into the pump.

The invention claimed is:

1. A low profile cooling device comprising:
   a rotor configured to rotate about an axis;
   a top plate comprising an air inlet and a first heat transfer surface;
   a bottom plate comprising a second heat transfer surface facing the first surface, the bottom plate without an opening extending therethrough, the surfaces being perpendicular to the axis and spaced apart in the axial direction between 1 mm and 10 mm, at least a portion of the rotor disposed between the plates; and
   an interior volume without physical structures therein that is defined by and between the surfaces of the plates, the interior volume surrounding the rotor and radially extending a distance of at least 7 mm away from the rotor such that one or more toroidal vortices are generated within the interior volume upon rotation of the rotor, thereby forming a plurality of impingement zones on the surfaces.

2. The cooling device as claimed in claim 1, wherein: the heat transfer surfaces are spaced apart 4 mm in the axial direction.

3. The cooling device as claimed in claim 1, wherein the heat transfer surfaces are substantially parallel.

4. The cooling device as claimed in claim 1, wherein the plates are coupled by heat-conducting support pillars.

5. The cooling device as claimed in claim 1, wherein the plates are disc-shaped.

6. The cooling device as claimed in claim 1, wherein the-inlet is centrally located in the top plate.

7. The cooling device as claimed in claim 1, wherein the rotor is rotatable by a motor.

8. The cooling device as claimed in claim 1, wherein the rotor comprises a plurality of angled rotor blades.

9. The cooling device as claimed in claim 1, further comprising a heat pipe.

10. The cooling device as claimed in claim 1, wherein the cooling device is one in a bank of multiple cooling devices.

11. The cooling device as claimed in claim 1, wherein at least one of the surfaces comprises a surface of a circuit board.

12. The cooling device as claimed in claim 1, wherein at least one of the surfaces comprises a surface of a housing.

13. The cooling device as claimed in claim 1, wherein the cooling device is integrated into a portable device.

14. The cooling device as claimed in claim 13, wherein the portable device is a mobile phone or a laptop computer.

15. A cooling device comprising:
   a rotor configured to rotate about an axis and comprising a plurality of blades;
   a top plate comprising an inlet and a first surface;
   a bottom plate comprising a second surface facing and spaced apart from the first surface between 1 mm and 10 mm, the bottom plate without an opening extending therethrough; and
   one or more couplings that couple the plates to form an interior volume without physical structures between the surfaces of the plates, the interior volume surrounding the rotor and radially extending a distance of at least 7 mm away from the rotor such that one or more toroidal vortices are generated with the interior volume upon rotation of the rotor, thereby forming a plurality of impingement zones on the surfaces.

16. The device of claim 1, wherein a ratio of a cross-section of the rotor to a cross-section of the plates is less than 0.6.

17. The device of claim 15, wherein a ratio of a cross-section of the rotor to a cross-section of the plates is less than 0.6.

18. The device of claim 1, wherein the interior volume extends to one or more side outlets.

19. The device of claim 15, wherein the interior volume extends to one or more side outlets.

* * * * *